United States Patent
Shin et al.

[11] Patent Number: 6,165,842
[45] Date of Patent: Dec. 26, 2000

[54] METHOD FOR FABRICATING A NON-VOLATILE MEMORY DEVICE USING NANO-CRYSTAL DOTS

[75] Inventors: Hyung Cheol Shin; Ii Gweon Kim, both of Taejon; Jong Ho Lee, Iksan-shi, all of Rep. of Korea

[73] Assignee: Korea Advanced Institute Science and Technology, Taejon, Rep. of Korea

[21] Appl. No.: 09/353,321

[22] Filed: Jul. 14, 1999

[30] Foreign Application Priority Data

Jul. 15, 1998 [KR] Rep. of Korea ................ 98-28534

[51] Int. Cl.[7] .................................................. H01L 21/336
[52] U.S. Cl. .......................... 438/257; 438/704; 438/705; 438/743; 438/753; 438/962
[58] Field of Search ..................... 438/257, 704, 438/705, 745, 753, 962

[56] References Cited

U.S. PATENT DOCUMENTS

| | | |
|---|---|---|
| 4,802,951 | 2/1989 | Clark et al. . |
| 5,256,587 | 10/1993 | Jun et al. . |
| 5,714,766 | 2/1998 | Chen et al. . |
| 5,753,559 | 5/1998 | Yew et al. . |
| 5,801,401 | 9/1998 | Forbes . |
| 5,937,295 | 8/1999 | Chen et al. . |
| 5,943,571 | 8/1999 | Schaefer et al. . |
| 5,977,612 | 11/1999 | Bour et al. . |
| 5,989,958 | 11/1999 | Forbes . |
| 6,009,018 | 12/1999 | Forbes . |
| 6,013,555 | 1/2000 | Yew et al. . |
| 6,025,627 | 2/2000 | Forbes et al. . |
| 6,060,743 | 5/2000 | Sugiyama et al. . |
| 6,087,197 | 1/1999 | Erigushi et al. . |
| 6,087,679 | 7/1998 | Yamazaki et al. . |
| 6,090,666 | 7/2000 | Ueda et al. . |

OTHER PUBLICATIONS

Shen et al, "Ultra fast write speed, long refresh time, low power F–N operated volitile memory cell with stacked nanocrystalline Si film," IEEE IEDM 96, pp. 515–1996.

Tiwari et al., "Volatile and Non–Volatile Memories in Silicon with Nano–Crystal Storage," *IEEE International Electron Device Meeting* pp. 521–524, 1995.

Hanafi et al., "Fast and Long Retention–Time Nano–Crystal Memory," *IEEE Transactions On Electron Devices* 43:9, 1553–1558, Sep. 1996.

Fukuda et al., "Resonant tunneling through a self–assembled Si quantum dot," *American Institute of Physics, Appl. Phys. Lett.* 70(70):2291–2293, Apr. 28, 1997.

Kim et al., "Room Temperature Single Electron Effects in Si Quantum Dot Memory with Oxide–Nitride Tunneling Dielectrics," *IEEE International Electron Device Meeting* pp. 111–114, 1998.

*Primary Examiner*—John F. Niebling
*Assistant Examiner*—Jonathan Hack
*Attorney, Agent, or Firm*—E. Russell Tarleton; Seed IP Law Group

[57] ABSTRACT

The present invention proposes a method for fabricating a non-volatile memory device using nano-crystals with an increased etching rate and an increased oxidation rate at the grain boundary, which is used in high-speed and low power consumption device. The method for fabricating a non-volatile memory device using nano-crystal dots comprises following processes. First process is to fabricate a tunneling dielectric 204 and a thin amorphous silicon continuous film. Second process is to fabricate a poly-silicon layer by poly-crystallizing the amorphous silicon film. Third process is to fabricate nano-crystals 212 by etching the poly-silicon layer. Fourth process is to fabricate an interlayer dielectric 214 on the nano-crystals 212. Fifth process is to attach a poly-silicon film to the interlayer dielectric 214 and fabricate a gate 216 and interconnects 220.

6 Claims, 10 Drawing Sheets

METHOD FOR FABRICATING A NON-VOLATILE MEMORY DEVICE USING NANO-CRYSTAL DOTS

BACKGROUND OF THE INVENTION

1. Field of the Invention

The present invention relates to a method for fabricating a non-volatile memory device that is used in high-speed and low power consumption device, more particularly to a method for fabricating a non-volatile memory device using nano-crystal dots with an increased in etching rate and an increased oxidation rate at the grain boundary.

2. Description of the Conventional Art

As shown in FIGS. 1A through 1F, conventional methods use incubation time to fabricate nano-crystal in fabricating poly-silicon. FIG. 1A shows a process in which poly-silicon is incubated in short amount of time on a tunneling dielectric 104 fabricated on a silicon substrate and thereby nano-crystals 106 are fabricated. FIG. 1B shows a process in which an interlayer dielectric 108 is fabricated on the nano-crystals 106. FIG. 1C shows a process in which a control gate 110 is etched after a poly-silicon film for the control gate 110 is attached to the interlayer dielectric 108.

FIG. 1D shows a process in which complete gate etching is performed with the control gate 110 used as a self-mask. FIG. 1E shows a process in which an oxide film 112 is fabricated by low press chemical vapor deposition (LPCVD) for insulation between the control gate 110 and a metal interconnect layer to be formed in a subsequent process. FIG. 1F shows a process in which a contact hole is implemented in the tunneling dielectric 104 that becomes a drain 116 and the oxide film 112 and then a metal interconnect layer 114 is sputtered on the contact hole and etching for patterning is performed.

In conventional methods, because the nano-crystals are fabricated within a very short incubation time in a poly-silicon deposition process, there are several drawbacks such that the process control is difficult, the size of nano-crystal dots is not uniform, and reproducibility is low.

REFERENCES

IEEE International Electron Device Meeting, 1998, pp. 111~114, Ilgweon Kim et al., "Room Temperature Single Electron Effects in Si Quantum Dot Memory with Oxide-Nitride Tunneling Dielectrics".

IEEE Transactions on Electron Devices, Vol. 43, No. 9, September 1996, pp. 1553~1558, Hussein I. Hanafi, Sandip Tiwari, and Imran Khan, "Fast and Long Retention-Time Nano-Crystal Memory".

Applied Physics Letter, Vol. 70, No. 17, April 1997, pp 2291~2293, M. Fukuda et al., "Resonant Tunneling through a Self-assembled Si Quantum Dot".

IEEE International Electron Device Meeting, Washington, 1995, pp. 521~524, Sandip Tiwari et al., "Volatile and Non-Volatile Memories in Silicon with Nano-Crystal Storage".

SUMMARY OF THE INVENTION

The present invention provides a method that guarantees a repeatable process of forming uniform, small-size and high-density nano-crystal to overcome inconveniences of conventional methods.

To accomplish such objectives, a method for fabricating a non-volatile memory device using nano-crystal dots in accordance with the present invention comprises following processes. First process is to fabricate a tunneling dielectric and a thin amorphous silicon continuous film. Second process is to fabricate poly-silicon by poly-crystallizing the thin amorphous silicon continuous film. Third process is to fabricate nano-crystals by etching the poly-silicon. Fourth process is to fabricate an interlayer dielectric on the nano-crystal. Fifth process is to attach a poly-silicon film to the interlayer dielectric and fabricate a gate and interconnects.

Another method for fabricating a non-volatile memory device using nano-crystal dots in accordance with the present invention comprises following processes.

First process is to fabricate a tunneling dielectric and a thin amorphous silicon continuous film. Second process is to fabricate a poly-silicon layer by poly-crystallizing the thin amorphous silicon continuous film. Third process is to fabricate an oxide film and thereby fabricating nano-crystals by oxidizing said poly-silicon layer. Fourth process is to fabricate an interlayer dielectric on the nano-crystals. Fifth process is to attach a poly-silicon film to the interlayer dielectric and fabricate a gate and interconnects.

DETAILED DESCRIPTION OF THE PREFERRED EMBODIMENTS

Several preferred embodiments of the present invention will be explained with reference to the accompanying drawings.

As shown in FIGS. 2A through 2J, first process in a first embodiment of the method for fabricating a non-volatile memory device using nano-crystal dots in accordance with the present invention is to fabricate a very thin amorphous continuous film. Second is to fabricate an oxide film and then polycrystalize the film through oxidation and heat treatment. Third is to remove the oxidation film and Secco-etching or Wright-etching is performed to fabricate a non-volatile memory device. In the process, uniform and high-density nano-crystals are implemented using increase in etching rate at grain boundary.

Figure 1A:
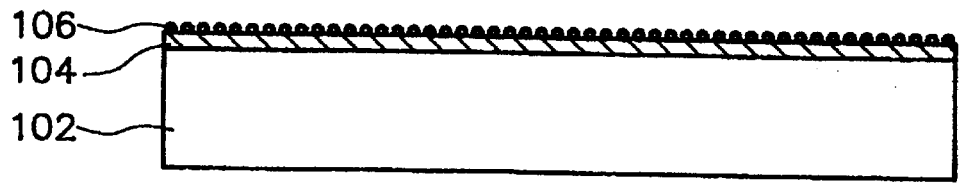
FIGS. 1A through 1F show processes in which a nano-crystal nonvolatile memory device is fabricated for an incubation time in a poly-silicon deposition process in accordance with a conventional method.
Figure 1B:
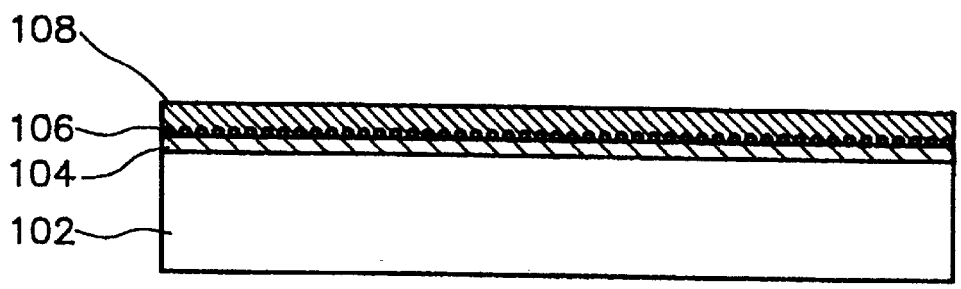
Figure 1C:
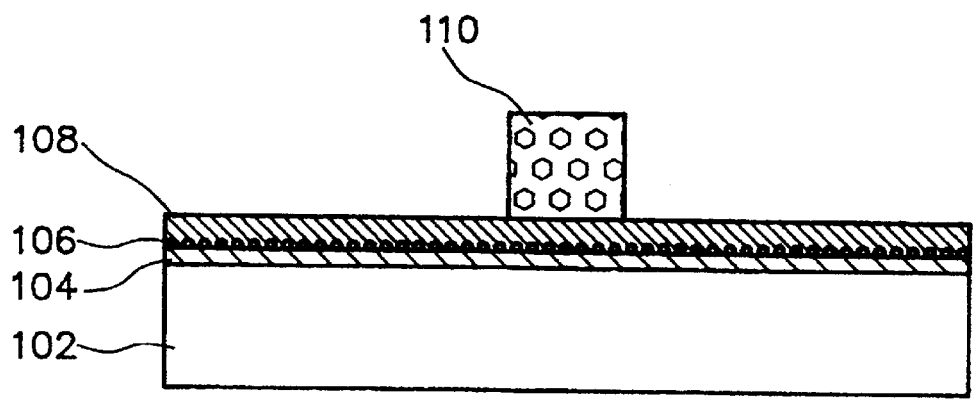
Figure 1D:
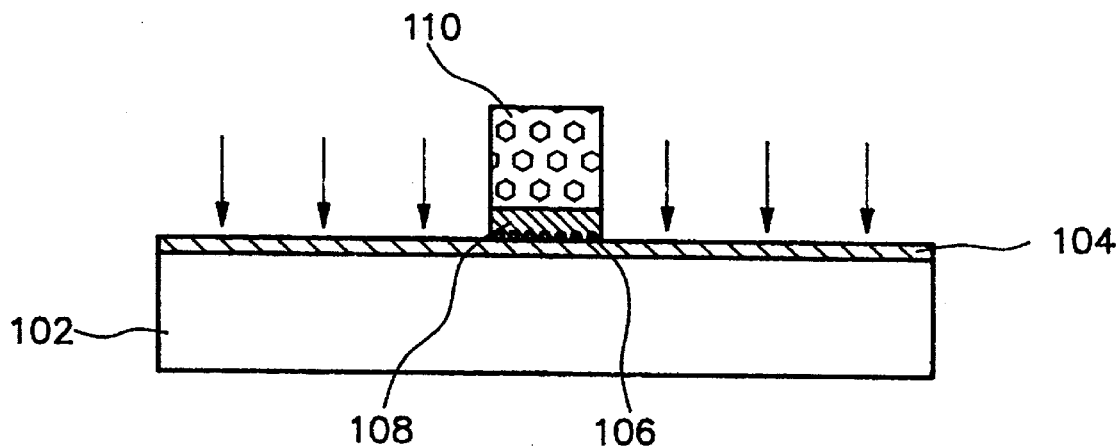
Figure 1E:
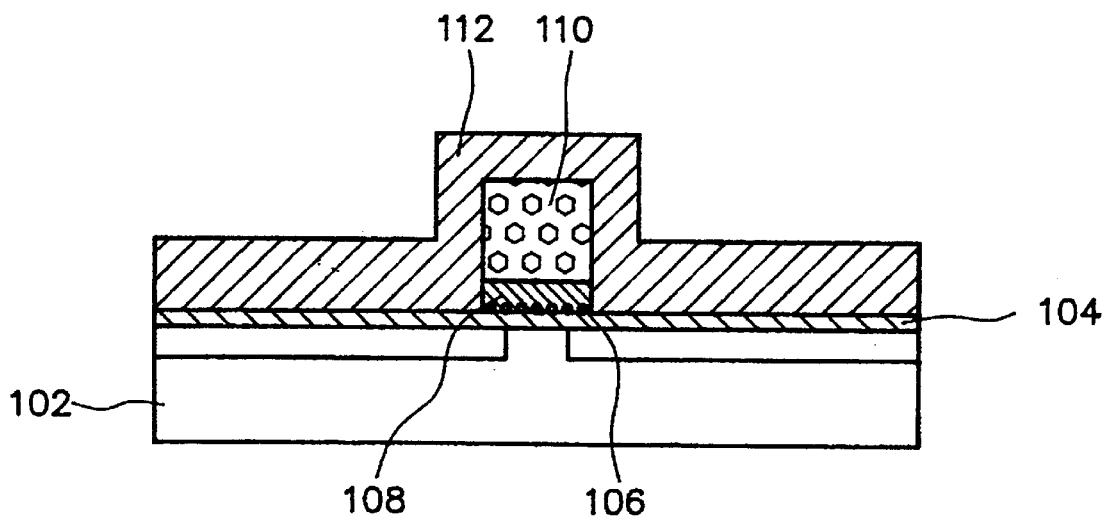
Figure 1F:
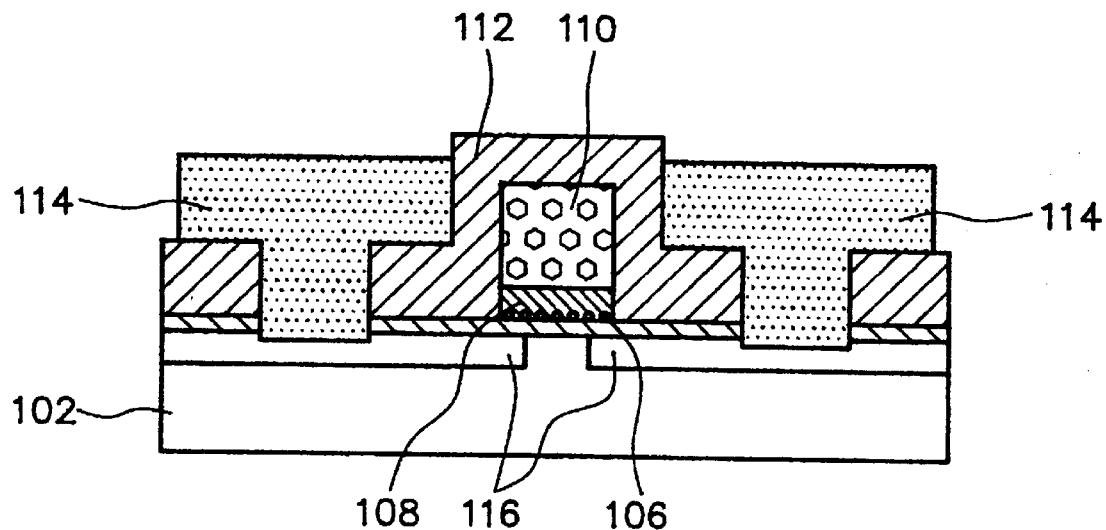
Figure 2A:
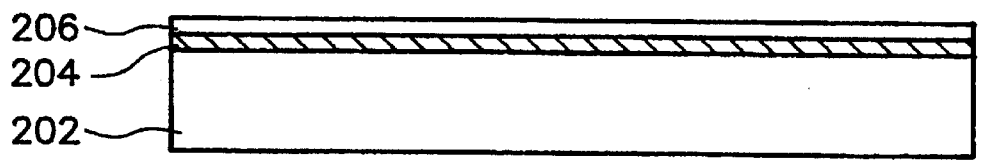
FIGS. 2A through 2J show processes in a first embodiment of the method for fabricating a non-volatile memory device using nano-crystal dots in accordance with the present invention.
Figure 2B:
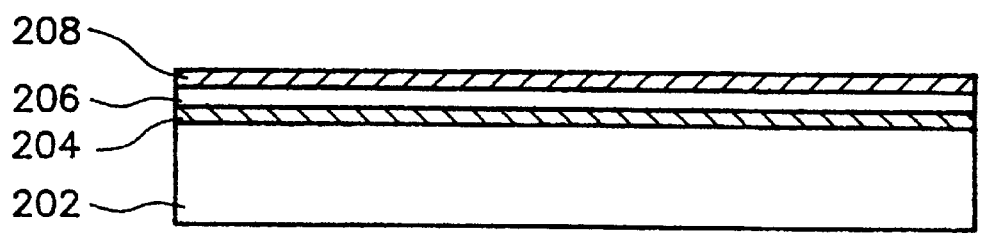
Figure 2C:
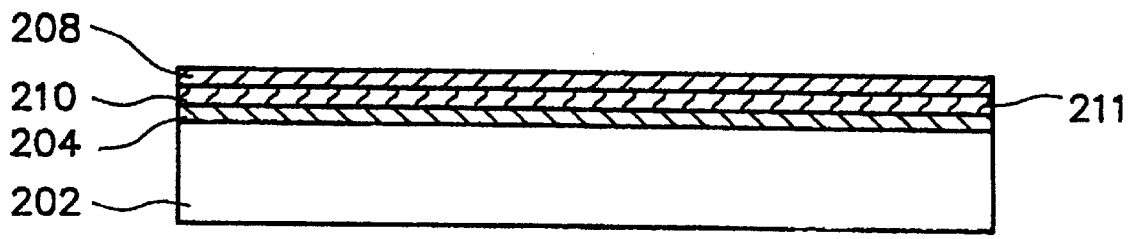

FIG. 2A shows a process in which a tunneling dielectric 204 is fabricated and a very thin amorphous silicon continuous film 206 is fabricated by growing amorphous silicon at low temperature on the tunneling dielectric 204. FIG. 2B shows a process in which an oxide film 208 is fabricated on the very thin amorphous silicon continuous film 206 by low press chemical vapor deposition (LPCVD). FIG. 2C shows a process in which a poly-silicon layer 210 is fabricated by oxidizing or heating the amorphous silicon film 206. Grain boundary 211 is fabricated on the poly-silicon layer 210 by the oxide film 208.

Figure 2D:
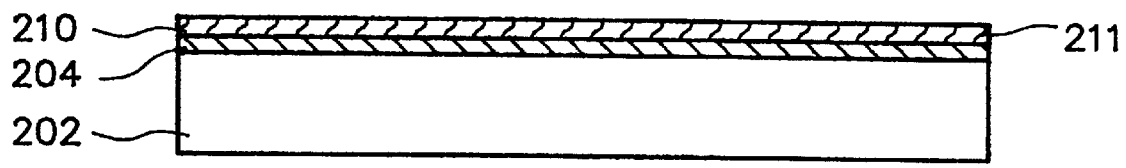
Figure 2E:
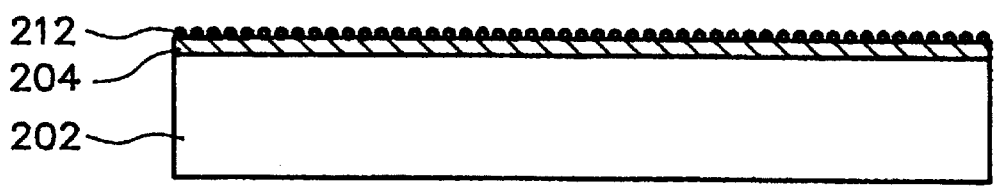
Figure 2F:
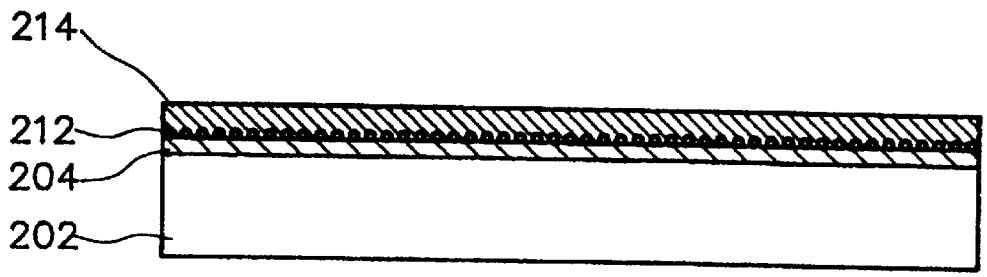
Figure 2G:
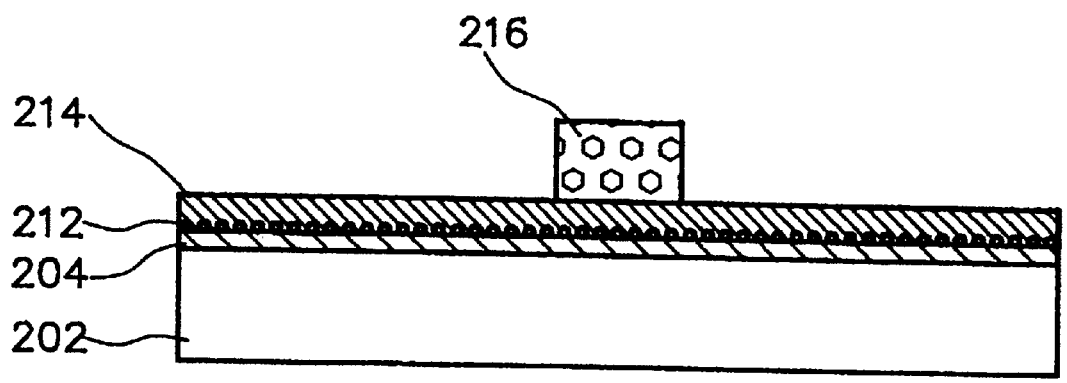

FIG. 2D shows a process in which the oxide film 208 is removed. FIG. 2E shows a process in which nano-crystals 212 are fabricated by Secco-etching or Wright-etching on the poly-silicon layer 210. Because etching rate is increased at the grain boundary 211 of the poly-silicon layer 210, high-density nano-crystals 212 are fabricated. FIG. 2F shows a process in which an interlayer dielectric 214 is fabricated. FIG. 2G shows a process in which a poly-silicon film is attached and then etched so that a control gate 216 is formed.

Figure 2H:
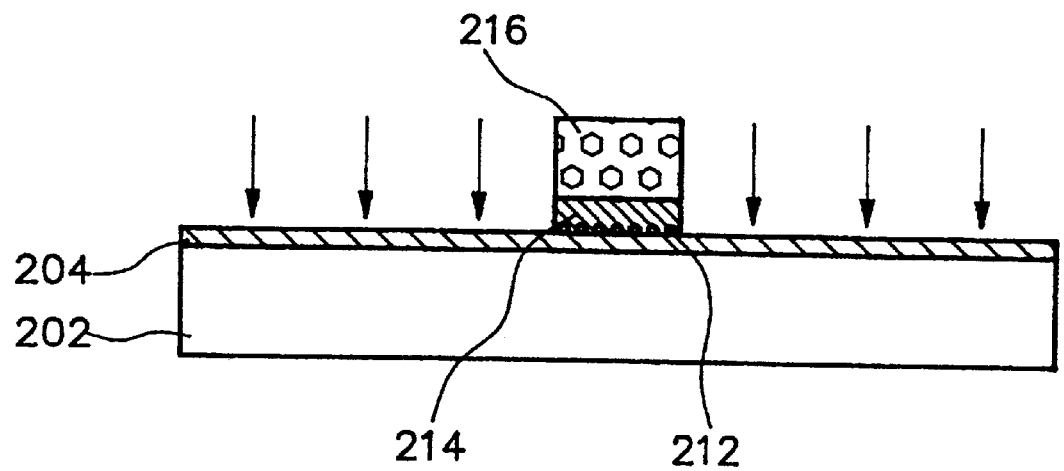
Figure 2I:
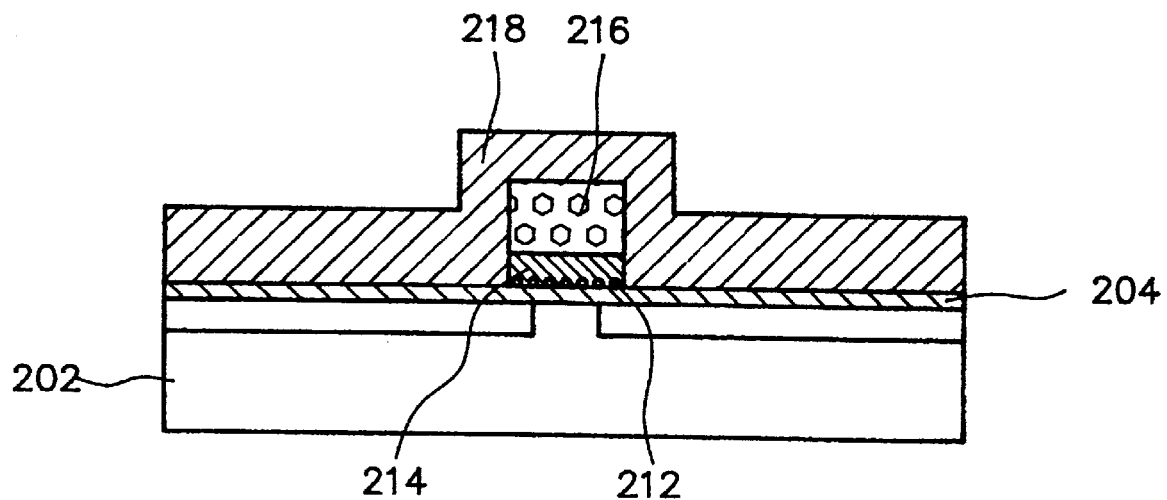
Figure 2J:
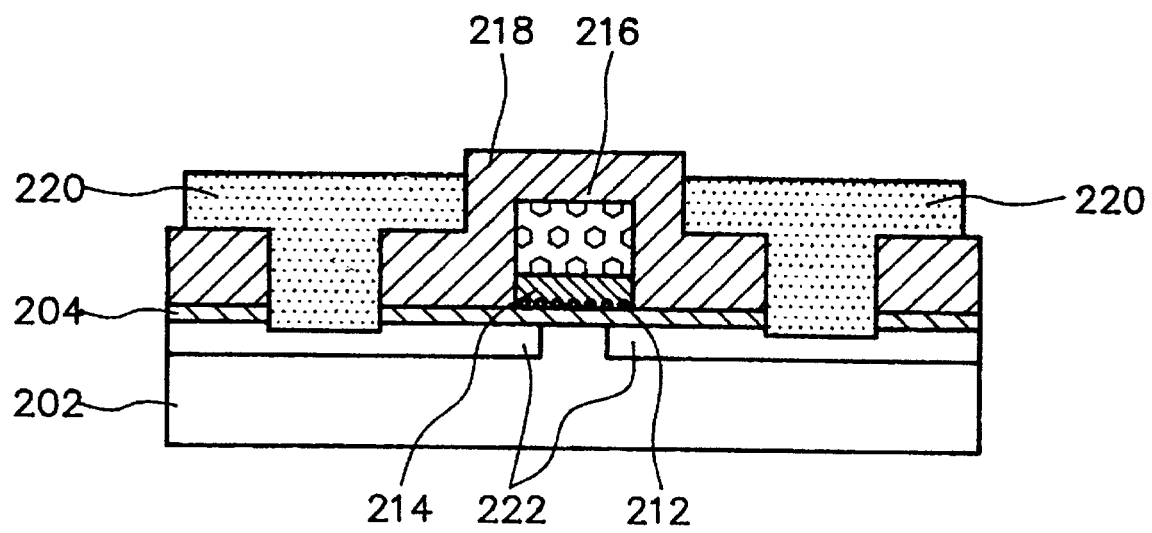

FIG. 2H shows a process in which gate etching is completed using the control gate 216 as a self-mask. FIG. 2I shows a process in which the oxide film 218 is fabricated by low press chemical vapor deposition (LPCVD) for insulation between the control gate 216 and a metal interconnect layer to be formed in a subsequent process. FIG. 2J shows a process in which a contact hole is implemented in tunneling dielectric 204 that becomes a source/drain 222 and the oxide film 218, and then a metal interconnect layer 220 is sputtered on the contact hole and etching is performed.

FIGS. 3A through 3K—show processes in a second embodiment of the method for fabricating a non-volatile memory device using nano-crystal dots in accordance with the present invention. First, a very thin amorphous silicon continuous film is fabricated. Second, the amorphous silicon film is crystallized by heat treatment. Third, a non-volatile memory device is fabricated by oxidizing to increase oxidation rate in grain boundary.

Figure 3A:
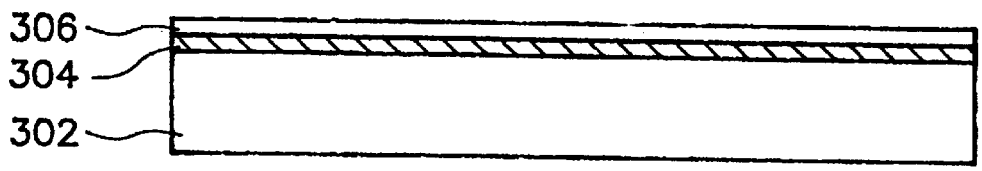
FIGS. 3A through 3K show processes in a second embodiment of the method for fabricating a non-volatile memory device using nano-crystal dots in accordance with the present invention.
Figure 3B:
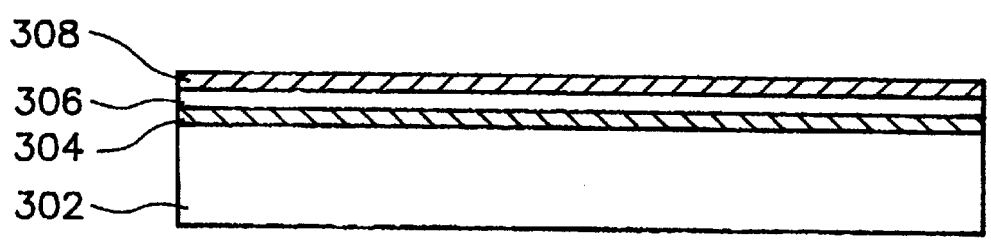
Figure 3C:
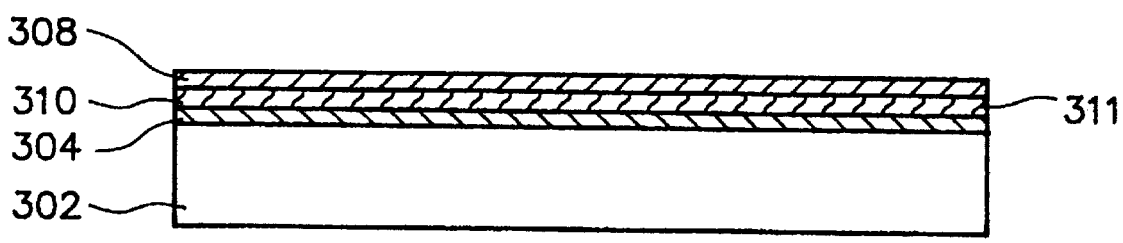

FIG. 3A shows a process in which a tunneling dielectric 304 is fabricated on a silicon substrate 302 and a very thin amorphous silicon continuous film 306 is fabricated on the tunneling dielectric 304. FIG. 3B shows a process in which an oxide film 308 is fabricated on the amorphous silicon film 306 by low press chemical vapor deposition (LPCVD). FIG. 3C shows a process in which a poly-silicon layer 310 is fabricated by oxidizing or heating the amorphous silicon film 306. The oxide film 308 makes a uniform grain boundary in the poly-silicon layer 310.

Figure 3D:
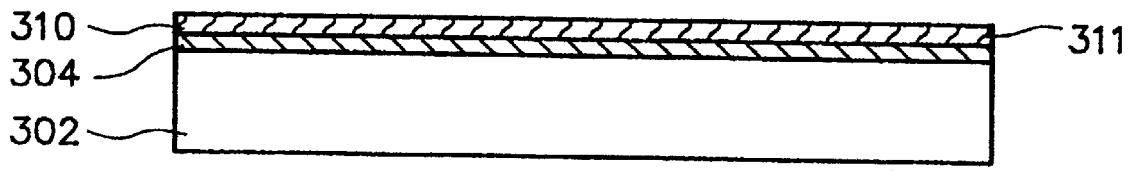
Figure 3E:
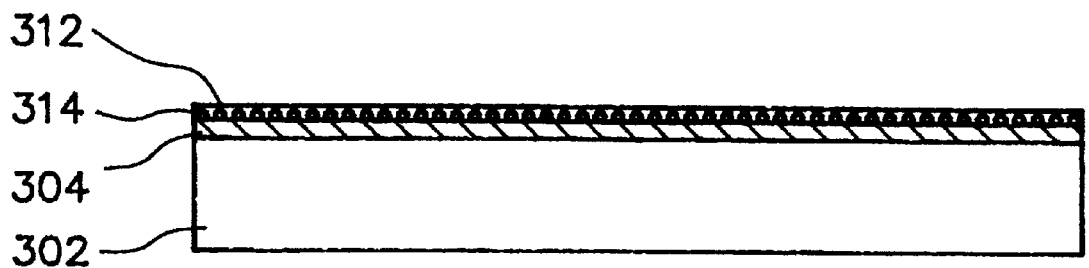

FIG. 3D shows a process in which the oxide film 308 is removed. FIG. 3E shows a process in which a new oxide film and a nano-crystal is fabricated by oxidizing the poly-silicon layer 310. Since oxidation rate is increased at the grain boundary 311, uniformly distributed and high-density nano-crystals 314 are fabricated.

Figure 3F:
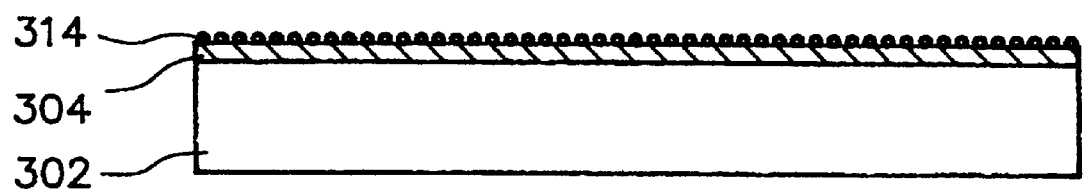
Figure 3G:
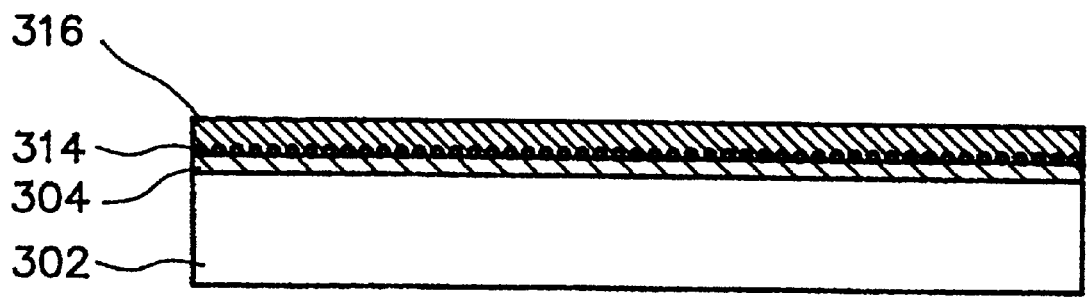
Figure 3H:
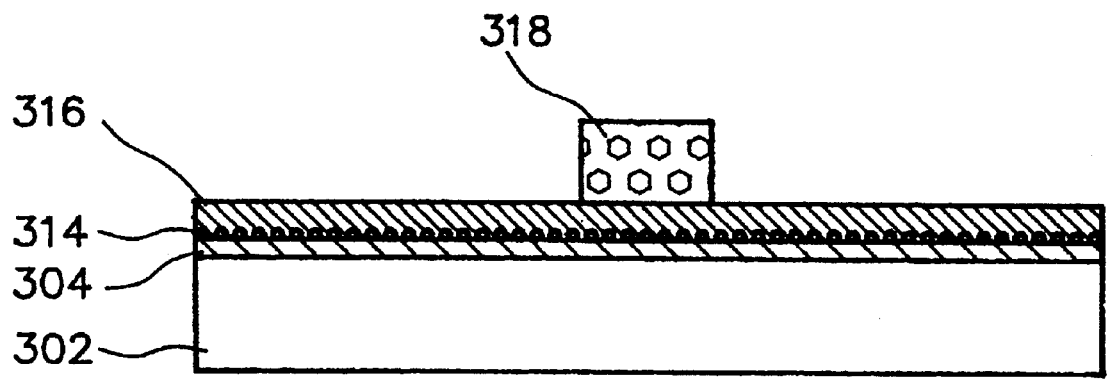
Figure 3I:
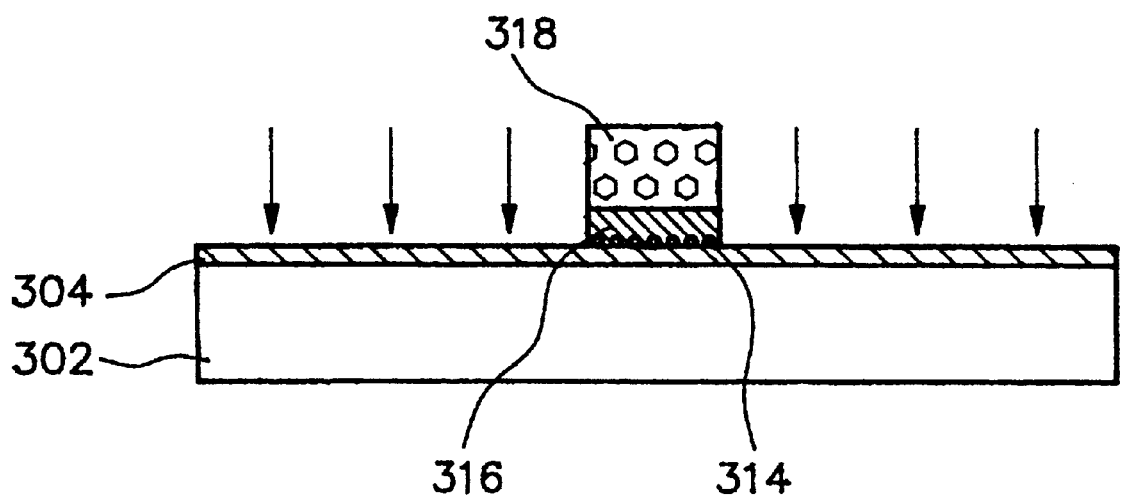
Figure 3J:
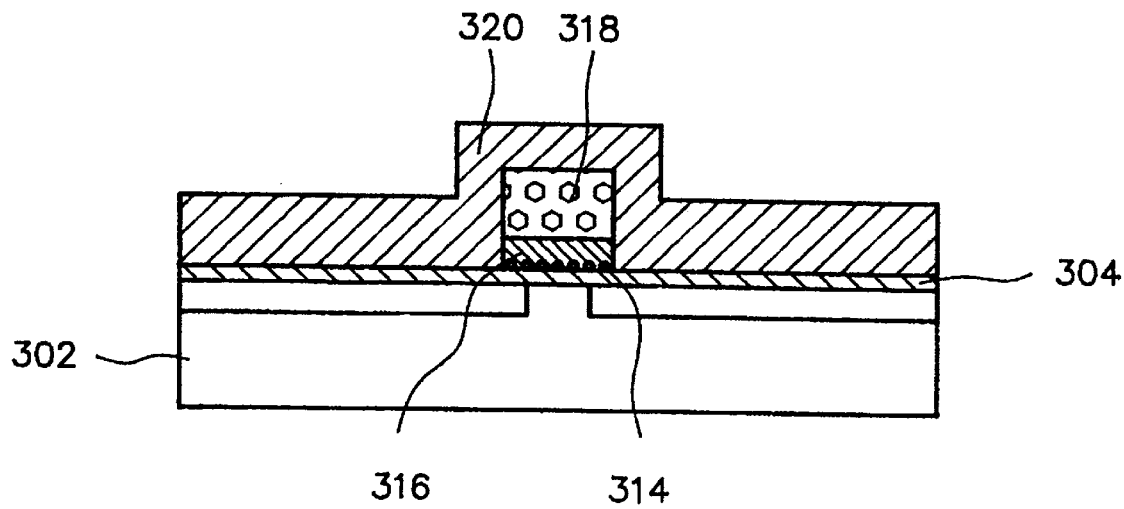
Figure 3K:
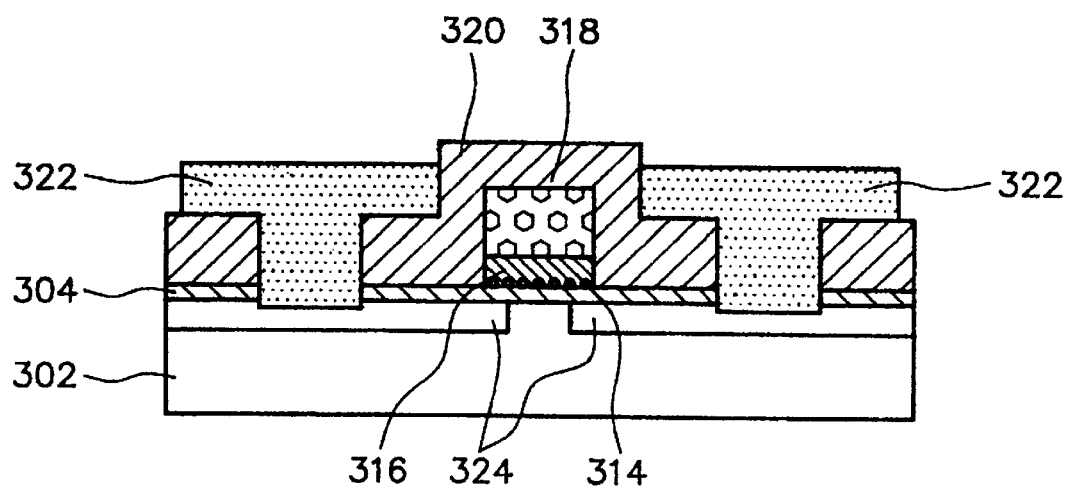

FIG. 3F shows a process in which the oxide film 312 is removed. FIG. 3G shows a process in which an interlayer dielectric 316 is fabricated. FIG. 3H shows a process in which a poly-silicon film is attached and then etched so that a control gate 318 is formed. FIG. 3I shows a process in which gate etching is completed using the control gate 318 as a self-mask. FIG. 3j shows a process in which an oxide film 320 is fabricated by low press chemical vapor deposition (LPCVD) for insulation between the control gate 318 and a metal interconnect layer to be formed in a subsequent process. FIG. 3K shows a process in which a contact hole is implemented in the tunneling dielectric 304 that becomes a source/drain 324 and the oxide film 320, and then a metal interconnect layer 322 is sputtered on the contact hole and etching is performed.

As shown above, the present invention provides a method for uniform and high-density nano-crystals using increase in etching rate at the grain boundary. In addition, the reproducibility of the present invention is fairly high.

Although the preferred embodiments of the present invention have been disclosed for illustrative purposes, those skilled in related art will appreciate that various modifications, additions and substitutions are possible, without departing from the scope and spirit of the invention as recited in the accompanying claims.

What is claimed is:

1. A method for fabricating a non-volatile memory device using nano-crystal dots, wherein the method comprises processes for:

fabricating a tunneling dielectric and a thin amorphous silicon continuous film;

fabricating a poly-silicon layer by poly-crystallizing said amorphous silicon film;

fabricating nano-crystals by etching on said poly-silicon layer;

fabricating an interlayer dielectric on said nano-crystals; and attaching a poly-silicon film to said interlayer dielectric and fabricating a gate and interconnects.

2. The method for fabricating a non-volatile memory device using nanocrystal dots according to claim 1, wherein the method further comprises a process for fabricating an oxide film on said amorphous silicon film and fabricating a poly-silicon layer by heating or oxidizing said oxide film.

3. The method for fabricating a non-volatile memory device using nano-crystal dots according to claim 1, wherein etching for fabricating said nano-crystals comprises Secco-etching on said poly-silicon layer.

4. The method for fabricating a non-volatile memory device using nano-crystal dots according to claim 1, wherein etching for fabricating said nano-crystals comprises Wright-etching on said poly-silicon layer.

5. A method for fabricating a non-volatile memory device using nano-crystal dots, wherein the method comprises processes for:

fabricating a tunneling dielectric and a thin amorphous silicon continuous film;

fabricating a poly-silicon layer by poly-crystallizing said amorphous silicon film;

fabricating an oxide film and thereby fabricating nano-crystals by oxidizing said poly-silicon layer;

fabricating an interlayer dielectric on said nano-crystals; and attaching a poly-silicon film to said interlayer dielectric and fabricating a gate and interconnects.

6. The method for fabricating a non-volatile memory device using nanocrystal dots according to claim 5, wherein the method further comprises a process for fabricating an oxide film on said amorphous silicon film and fabricating a poly-silicon layer by heating or oxidizing said oxide film.

* * * * *